United States Patent
Matsumoto

(10) Patent No.: US 8,686,465 B2
(45) Date of Patent: Apr. 1, 2014

(54) GLASS, GLASS COVERING MATERIAL FOR LIGHT-EMITTING DEVICE, AND LIGHT-EMITTING DEVICE

(75) Inventor: Syuji Matsumoto, Chiyoda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 263 days.

(21) Appl. No.: 13/339,577

(22) Filed: Dec. 29, 2011

(65) Prior Publication Data

US 2012/0187448 A1 Jul. 26, 2012

(30) Foreign Application Priority Data

Jan. 20, 2011 (JP) .................................. 2011-010242

(51) Int. Cl.
*H01L 33/00* (2010.01)

(52) U.S. Cl.
USPC .............. 257/100; 257/E33.059; 257/E33.06; 428/40.4; 428/49; 428/325

(58) Field of Classification Search
USPC ............ 257/E33.059, E33.06, 100; 428/40.4, 428/49, 325
See application file for complete search history.

(56) References Cited

U.S. PATENT DOCUMENTS

| | | |
|---|---|---|
| 5,281,560 A | 1/1994 | Francis et al. |
| 2005/0255985 A1 | 11/2005 | Masuda |
| 2010/0065882 A1 | 3/2010 | Matsumoto et al. |
| 2010/0252858 A1* | 10/2010 | Matsumoto et al. .......... 257/100 |
| 2013/0174608 A1* | 7/2013 | Takeuchi et al. ................. 65/40 |

FOREIGN PATENT DOCUMENTS

| | | |
|---|---|---|
| EP | 2 228 350 A1 | 9/2010 |
| JP | 7-69672 | 3/1995 |
| JP | 2010-177548 | 8/2010 |

OTHER PUBLICATIONS

The Exteded European Search Report issued Apr. 18, 2012, in Application No. / Patent No. 12000040.1.

* cited by examiner

*Primary Examiner* — Matthew Reames
(74) *Attorney, Agent, or Firm* — Oblon, Spivak, McClelland, Maier & Neustadt, L.L.P.

(57) ABSTRACT

Glass is provided which is capable of covering at a covering treatment temperature of at most 400° C. and which has a low thermal expansion coefficient and excellent weather resistance. Glass comprising, as represented by mol % based on oxides, from 29% to 33% of $P_2O_5$, from 43% to 58% of SnO, from 11% to 25% of ZnO, from 0.1% to 2% of $Ga_2O_3$, from 0.5% to 5% of CaO, and from 0% to 1% of SrO, provided that the sum X of ZnO, $Ga_2O_3$ and CaO is within a range of from 13% to 27%, as represented by mol % based on oxides.

7 Claims, 2 Drawing Sheets

GLASS, GLASS COVERING MATERIAL FOR LIGHT-EMITTING DEVICE, AND LIGHT-EMITTING DEVICE

TECHNICAL FIELD

The present invention relates to glass, particularly glass to be used as a covering material for a light-emitting device such as a light-emitting diode (LED) device.

BACKGROUND ART

Heretofore, in a light-emitting diode (LED) device, an organic material such as a resin has been used as a covering material to seal or cover a LED element and a substrate supporting such a LED element (hereinafter generally referred to as a "LED assembly". However, a problem has been pointed out such that the covering material made of a resin is susceptible to deterioration by heat formed during the operation of the LED device, light and/or the environmental moisture, and its useful life is short.

Therefore, for covering a LED assembly, it has been studied to use a covering material made of glass which is more stable as compared with a resin. However, if conventional common silicate glass is used as a coating material for a LED assembly, a covering treatment temperature of about 500° C. or higher is required from the restriction of the glass softening point. For various components constituting a LED device, covering treatment at such high temperature is not desirable from the viewpoint of the reliability. In order to employ glass as a covering material, glass is required which is capable of carrying out covering treatment of a LED assembly at a covering treatment temperature of less than 500° C., particularly at most 400° C.

Further, Patent Document 1 discloses tin phosphate type glass having at least one of $R_2O$ (wherein R is Li, Na and/or K), $B_2O_3$, $Al_2O_3$, $SiO_2$ and $WO_3$ added, to form fusion seal between electronic or electric components.

PRIOR ART DOCUMENT

Patent Document

Patent Document 1: JP-A-7-69672

DISCLOSURE OF INVENTION

Technical Problem

However, the glass disclosed in Patent Document 1 is not supposed to be used as a covering material to seal or cover a LED assembly and thus has the following problems.

The glass disclosed in Patent Document 1 is poor in the weather resistance, and a covering material made of such glass, or a LED assembly sealed by such a covering material has a problem in a long-term stability.

Further, the glass disclosed in Patent Document 1 has a problem such that as compared with the coefficient of thermal expansion of a common LED element, its coefficient of thermal expansion is high (e.g. at a level of from 120 to 140×$10^{-7}$/° C.). For example, the coefficient of thermal expansion of a common LED element laminated on e.g. a sapphire substrate is within a range of from about 70 to 80×$10^{-7}$/° C., which value is about a half of the glass disclosed in Patent Document 1.

Therefore, even if good adhesion is obtained between the glass covering material and the LED element at the time of the covering treatment, in the subsequent cooling process or storage process of the LED device, the covering material is likely to be cracked or broken due to the difference in the coefficient of thermal expansion between them. If the sealing material has such cracks, the function as the sealing material will be substantially impaired.

Thus, there still is a strong demand for glass which can be used as a covering material for a LED assembly and which has a low coefficient of thermal expansion and a long-term stability.

The present invention has been made under these circumstances, and it is an object of the present invention to provide glass which is capable of covering at a covering treatment temperature of at most 400° C. and which has a low coefficient of thermal expansion and excellent weather resistance. Further, another object of the present invention is to provide a covering material for a light-emitting device, made of such glass, and a light-emitting device having such a covering material.

Solution to Problem

The present invention provides glass comprising, as represented by mol % based on oxides, from 29% to 33% of $P_2O_5$, from 43% to 58% of SnO, from 11% to 25% of ZnO, from 0.1% to 2% of $Ga_2O_3$, from 0.5% to 5% of CaO, and from 0% to 1% of SrO, provided that the sum X of ZnO, $Ga_2O_3$ and CaO is within a range of from 13% to 27%, as represented by mol % based on oxides.

Here, the glass of the present invention preferably comprises, as represented by mol % based on oxides, from 30% to 33% of $P_2O_5$, from 44% to 53% of SnO, from 13% to 24% of ZnO, from 0.1% to 2% of $Ga_2O_3$, from 0.5% to 3% of CaO, and from 0% to 1% of SrO, wherein said X is within a range of from 18% to 26%.

Further, the glass of the present invention preferably has a coefficient of linear thermal expansion of at most 120×$10^{-7}$/° C.

Further, the present invention provides a glass covering material for a light-emitting device, which is made of the glass having the above-described characteristics.

In such a case, the light-emitting device may be a light-emitting device using a LED element.

Further, the present invention provides a light-emitting device comprising an optical element disposed on a base substrate, and a covering material covering the optical element, wherein the covering material is made of the glass having the above-described characteristics.

Here, in the light-emitting device of the present invention, the optical element may be LED.

Advantageous Effects of Invention

According to the present invention, it is possible to provide glass which is capable of covering at a covering treatment temperature of at most 400° C. and which has a low coefficient of thermal expansion and excellent weather resistance. Further, according to the present invention, it is possible to provide a covering material for a light-emitting device, which is made of such glass, and a light-emitting device having such a covering material.

DESCRIPTION OF EMBODIMENT

Figure 1:
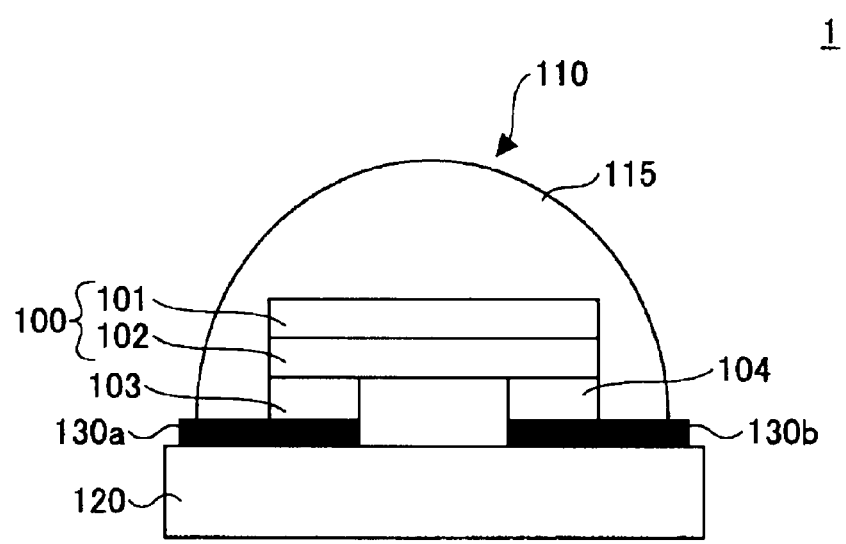
FIG. 1 is a view schematically illustrating an example in cross-section of a light-emitting device by the present invention.

Now, with reference to the drawings, an embodiment of the present invention will be described in detail. Here, the following embodiment is presented as an example, and it should be understood that various modifications may be made within a range not departing from the technical concept of the present invention.

The present invention provides glass comprising, as represented by mol % based on oxides, from 29% to 33% of $P_2O_5$, from 43% to 58% of SnO, from 11% to 25% of ZnO, from 0.1% to 2% of $Ga_2O_3$, from 0.5% to 5% of CaO, and from 0% to 1% of SrO, provided that the sum X of ZnO, $Ga_2O_3$ and CaO is within a range of from 13% to 27%, as represented by mol % based on oxides.

With such glass of the present invention, the softening point is controlled to be less than 400° C., and covering treatment at a temperature of at most 400° C. becomes possible. Further, the glass of the present invention has such a characteristic that it has excellent weather resistance. Further, the glass of the present invention has a coefficient of linear thermal expansion a which is controlled to be at most 120× $10^{-7}$/° C. Therefore, even when the glass of the present invention is used for covering treatment of a common LED assembly containing a LED element constituted by an InGaN/GaN semiconductor layer laminated on e.g. a sapphire substrate, it is possible to prevent a problem such that the covering material undergoes cracking or the covering material undergoes breakage due to a difference in the coefficient of linear thermal expansion between the glass covering material and the LED element.

By such characteristics, the glass of the present invention is sufficiently useful as a covering material for covering treatment of a light-emitting device at a temperature of at most 400° C. Further, when the glass of the present invention is used as a covering material for a light-emitting device, it is possible to provide a light-emitting device which exhibits stable properties over a long period of time.

With Respect to Components Contained in Glass of the Present Invention

Now, general characteristics and suitable contents of various components contained in the glass of the present invention will be described. Here, the content of each component mentioned hereinafter is represented by mol % based on oxides, unless otherwise specified. Further, the characteristics of each component mentioned hereinafter are merely exemplary and do not deny other characteristics and effects which such a component may have.

$P_2O_5$ is an essential component and a component to stabilize the glass and it is contained within a range of from 29% to 33% in the glass of the present invention. If the content of $P_2O_5$ is less than 29%, the glass transition temperature (Tg) tends to be high. Further, if it is attempted to prevent the increase of the glass transition temperature (Tg), it becomes necessary to increase the amount of SnO, whereby the coefficient of linear thermal expansion (a) is likely to be large. On the other hand, if the content of $P_2O_5$ exceeds 33%, the weather resistance tends to deteriorate. The content of $P_2O_5$ is particularly preferably within a range of from 30% to 33%.

SnO is an essential component and a component to increase the fluidity of the glass, and it is contained within a range of from 43% to 58% in the glass of the present invention. If the content of SnO is less than 43%, the glass transition temperature (Tg) is likely to be high. On the other hand, if the content of SnO exceeds 58%, the weather resistance tends to deteriorate. The content of SnO is particularly preferably within a range of from 44% to 53%.

ZnO is an essential component and a component to increase the fluidity of the glass, and it is contained within a range of from 11% to 25% in the glass of the present invention. If the content of ZnO is less than 11%, the coefficient of linear thermal expansion (α) is likely to be large. On the other hand, if the content of ZnO exceeds 25%, the glass transition temperature (Tg) is likely to be high. The content of ZnO is particularly preferably within a range of from 13% to 24%.

$Ga_2O_3$ is an essential component and a component to improve the weather resistance of the glass, and it is contained within a range of from 0.1% to 2% in the glass of the present invention. If the content of $Ga_2O_3$ is less than 0.1%, the weather resistance of the glass may not be sufficiently improved. On the other hand, if the content of $Ga_2O_3$ exceeds 2%, the glass transition temperature (Tg) is likely to be high. Further, from the viewpoint of the costs, it is preferred to reduce the amount of $Ga_2O_3$ as far as possible.

CaO is an essential component and a component to improve the weather resistance of the glass, and it is contained within a range of from 0.5% to 5% in the glass of the present invention. If the content of CaO is less than 0.5%, the weather resistance of the glass may not be sufficiently improved. On the other hand, if the content of CaO exceeds 5%, the glass transition temperature (Tg) is likely to be high. The content of CaO is particularly preferably within a range of from 0.5% to 3%.

SrO is a component to improve the weather resistance of the glass, and it is contained in an amount of up to 1% at the maximum in the glass of the present invention. However, addition of SrO is optional. If the content of SrO exceeds 1%, the glass transition temperature (Tg) is likely to be high.

Further, in the glass of the present invention, the sum X of $ZnO+Ga_2O_3+CaO$ is within a range of from 13% to 27%, preferably within a range of from 18% to 26%. If X is less than 13%, the coefficient of linear thermal expansion (a) of the glass is likely to be large. On the other hand, if X exceeds 27%, the glass transition temperature (Tg) is likely to be high.

The glass of the present invention is preferably composed substantially of the above components. However, within a range not to impair the purpose of the present invention, other components, e.g. $Bi_2O_3$, $Y_2O_3$, $Gd_2O_3$, $Ce_2O_3$, $CeO_2$, $TiO_2$, $GeO_2$, $TeO_2$, $Ta_2O_5$, etc. may be added.

Further, the glass of the present invention preferably contains substantially no PbO. Further, the glass of the present invention preferably contains substantially no $Li_2O$, $Na_2O$ or $K_2O$. If such compounds are present in a significant content in the glass, deterioration due to ionic diffusion to a semiconductor element is likely to occur. Further, the glass of the present invention preferably contains substantially no MnO, $Fe_2O_3$, $Co_2O_3$, $WO_3$, etc. If these compounds are present in a significant content in the glass, the transparency of the glass is likely to be impaired by coloration.

The glass transition temperature (Tg) of the glass of the present invention is controlled to be at most about 325° C. The reason is such that if the glass transition temperature (Tg) becomes higher than 325° C., the sealing temperature is likely to be at least 400° C. The glass transition temperature (Tg) is preferably less than 320° C.

The coefficient of linear thermal expansion (α) of the glass of the present invention is at most $120×10^{-7}$/° C., preferably at most about $115×10^{-7}$/° C. If the coefficient of linear thermal expansion (α) exceeds $120×10^{-7}/°$ C., after covering a LED assembly by the glass covering material, in a step of cooling such a LED device to room temperature or in subsequent steps thereof, the glass covering material is likely to undergo cracking, caused by the difference in the coefficient of thermal expansion between the glass covering material and the LED element.

Application Examples of Glass of the Present Invention

The glass of the present invention having the above-described composition is used as a covering material for a light-emitting device having a glass covering portion. Therefore, a construction of a light-emitting device wherein the glass of the present invention is applied as a covering material will be described with reference to a LED device as an example. Further, the glass of the present invention is also applicable as a covering material for other light-emitting devices.

FIG. 1 schematically illustrates an example in cross-section of a LED device 1 according to the present invention. The LED device 1 comprises a base substrate 120, a light-emitting portion 100 mounted on the base substrate 120, and a covering portion 110 covering the light-emitting portion 100.

On the surface of the base substrate 120 on the side where the light-emitting portion 100 is mounted, a plurality of wirings 130 (130a and 130b) are formed.

The base substrate 120 is constituted, for example, by a substrate made of an inorganic material such as alumina and having a rectangular shape with a thickness of from 0.2 mm to 1.2 mm. The wirings 130a and 130b formed on the surface of the base substrate 120 may, for example, be gold wirings formed by a gold paste.

The light-emitting portion 100 is constructed by setting the LED element 102 on a substrate 101 for element. The LED element 102 has a positive electrode 103 and a negative electrode 104 on the opposite side to the substrate 101 for element. The light-emitting portion 100 is set on the base substrate 120, so that these electrodes 103 and 104 are respectively contacted with the wirings 130a and 130b on the base substrate 120.

The LED element 102 is constituted by e.g. LED which emits ultraviolet light or blue light having a wavelength of from 360 to 480 nm, and LED having a light-emitting layer side of InGaN having In added to GaN and having a quantum well structure (InGaN type LED) may be mentioned as a typical example. However, LED having other specifications may, of course, be used. The coefficient of linear thermal expansion of the substrate 101 for element is, for example, from $70×10^{-7}$ to $90×10^{-7}/°$ C. In a usual case, as the material for the substrate 101 for element, sapphire having a coefficient of linear thermal expansion of about $80×10^{-7}/°$ C. is used.

The covering portion 109 is constituted by the covering material 115. This covering material 115 is made of the glass of the present invention having the above-described composition.

In such a LED device 1, the covering material 115 covering the light-emitting portion 100 can be formed at a covering treatment temperature of at most 400° C. Accordingly, it is possible to prevent a thermal damage of each component constituting the LED device 1. Further, this covering material 115 has a low coefficient of linear thermal expansion (α). Therefore, it is possible to avoid breakage of the covering material which may occur due to the difference in the coefficient of linear thermal expansion between the covering material and other components, for example, in a cooling step of the covering material or the storage period of the LED device. Further, this covering material 115 has excellent weather resistance. Therefore, it is possible to prevent deterioration after the use for a long period of time, which may be problematic in the case of conventional glass. Thus, in the present invention, it is possible to provide a LED device which exhibits a stable light emission over a long period of time.

EXAMPLES

Now, the present invention will be described in further detail with reference to Examples, but it should be understood that the present invention is by no means limited thereto.

Example 1

By the following method, glass (glass of Example 1) comprising, as calculated by mol % based on oxides, 30% of $P_2O_5$, 46% of SnO, 20.5% of ZnO, 0.5% of $Ga_2O_3$ and 3% of CaO, was prepared.

Firstly, in a glove box furnace maintaining a nitrogen atmosphere having a dew point of at most −50° C., prescribed amounts of tin pyrophosphate ($Sn_2P_2O_7$, manufactured by Nippon Chemical Industrial Co., Ltd.), tin oxide (SnO, manufactured by NIHON KAGAKU SANGYO CO., LTD.), zinc metaphosphate ($Zn(PO_3)_2$, manufactured by Nippon Chemical Industrial Co., Ltd.), calcium metaphosphate ($Ca(PO_3)_2$, manufactured by Nippon Chemical Industrial Co., Ltd.) and gallium oxide (GaO) were weighed, then sealed in a plastic bag and agitated for about one minute by a hand to mix the powder homogeneously.

Then, the obtained solid product was transferred to a room having a dew point of at most −70° C. and put in a quartz crucible. A quartz cover was put on the crucible, and the crucible was maintained at 900° C. for 30 minutes to melt the solid product. After completion of the melting treatment, this crucible was taken out from the furnace. Further, in order to mold the melt into a plate glass, molten glass in the crucible was introduced into a carbon mold. Thereafter, glass taken out from this carbon mold was put into a separate electric furnace maintained at 315° C. and maintained in this electric furnace for one hour and then cooled to room temperature over a period of 12 hours. The foregoing operation was all carried out in a glove box having a nitrogen atmosphere.

Via such a step, glass of Example 1 was obtained.

Further, in the above step, by using anhydrides for all powder materials and carrying out the operation in a sufficiently dried atmosphere having a low dew point, it was possible to minimize the moisture content in glass. In a case where the moisture content in glass may be large or in a case where a step of removing moisture later is included, it is also possible to use a liquid orthophosphoric acid material, etc.

Further, in the above step, melting was carried out in a nitrogen atmosphere in order to prevent a change of tin having a valency of +2 in the material to a valency of +4 during the melting (oxidation reaction). However, there is also a method wherein melting is carried out in atmospheric air by adding succharose or the like to the material to let excess oxygen burn off thereby to prevent an oxidation reaction in the glass melt.

Example 2

By the same method as in Example 1, glass (glass of Example 2) comprising, as calculated by mol % based on oxides, 30% of $P_2O_5$, 44% of SnO, 21% of ZnO, 2% of $Ga_2O_3$ and 3% of CaO, was prepared.

Example 3

By the same method as in Example 1, glass (glass of Example 3) comprising, as calculated by mol % based on oxides, 30% of $P_2O_5$, 46% of SnO, 19% of ZnO, 2% of $Ga_2O_3$ and 3% of CaO, was prepared.

Example 4

By the same method as in Example 1, glass (glass of Example 4) comprising, as calculated by mol % based on oxides, 30% of $P_2O_5$, 48% of SnO, 17% of ZnO, 2% of $Ga_2O_3$ and 3% of CaO, was prepared.

Example 5

By the same method as in Example 1, glass (glass of Example 5) comprising, as calculated by mol % based on oxides, 30% of $P_2O_5$, 50% of SnO, 15% of ZnO, 2% of $Ga_2O_3$ and 3% of CaO, was prepared.

Example 6

By the same method as in Example 1, glass (glass of Example 6) comprising, as calculated by mol % based on oxides, 30% of $P_2O_5$, 52% of SnO, 13% of ZnO, 2% of $Ga_2O_3$ and 3% of CaO, was prepared.

Example 7

By the same method as in Example 1, glass (glass of Example 7) comprising, as calculated by mol % based on oxides, 30% of $P_2O_5$, 46% of SnO, 20% of ZnO, 1% of $Ga_2O_3$ and 3% of CaO, was prepared.

Example 8

By the same method as in Example 1, glass (glass of Example 8) comprising, as calculated by mol % based on oxides, 30% of $P_2O_5$, 46% of SnO, 20% of ZnO, 2% of $Ga_2O_3$ and 2% of CaO, was prepared.

Example 9

By the same method as in Example 1, glass (glass of Example 9) comprising, as calculated by mol % based on oxides, 30% of $P_2O_5$, 46% of SnO, 21% of ZnO, 2% of $Ga_2O_3$ and 1% of CaO, was prepared.

Example 10

By the same method as in Example 1, glass (glass of Example 10) comprising, as calculated by mol % based on oxides, 30% of $P_2O_5$, 46% of SnO, 21.5% of ZnO, 2% of $Ga_2O_3$ and 0.5% of CaO, was prepared.

Example 11

By the same method as in Example 1, glass (glass of Example 11) comprising, as calculated by mol % based on oxides, 30% of $P_2O_5$, 46% of SnO, 22% of ZnO, 1% of $Ga_2O_3$ and 1% of CaO, was prepared.

Example 12

By the same method as in Example 1, glass (glass of Example 12) comprising, as calculated by mol % based on oxides, 30% of $P_2O_5$, 46% of SnO, 23% of ZnO, 0.5% of $Ga_2O_3$ and 0.5% of CaO, was prepared.

Example 13

By the same method as in Example 1, glass (glass of Example 13) comprising, as calculated by mol % based on oxides, 30% of $P_2O_5$, 46% of SnO, 20.7% of ZnO, 0.3% of $Ga_2O_3$ and 3% of CaO, was prepared.

Example 14

By the same method as in Example 1, glass (glass of Example 14) comprising, as calculated by mol % based on oxides, 30% of $P_2O_5$, 46% of SnO, 20.9% of ZnO, 0.1% of $Ga_2O_3$ and 3% of CaO, was prepared.

Example 15

By the same method as in Example 1, glass (glass of Example 15) comprising, as calculated by mol % based on oxides, 30% of $P_2O_5$, 45% of SnO, 21% of ZnO, 1% of $Ga_2O_3$ and 3% of CaO, was prepared.

Example 16

By the same method as in Example 1, glass (glass of Example 16) comprising, as calculated by mol % based on oxides, 30% of $P_2O_5$, 45% of SnO, 21.5% of ZnO, 0.5% of $Ga_2O_3$ and 3% of CaO, was prepared.

Example 17

By the same method as in Example 1, glass (glass of Example 17) comprising, as calculated by mol % based on oxides, 30% of $P_2O_5$, 45% of SnO, 21.7% of ZnO, 0.3% of $Ga_2O_3$ and 3% of CaO, was prepared.

Example 18

By the same method as in Example 1, glass (glass of Example 18) comprising, as calculated by mol % based on oxides, 30% of $P_2O_5$, 45% of SnO, 21.9% of ZnO, 0.1% of $Ga_2O_3$ and 3% of CaO, was prepared.

Example 19

By the same method as in Example 1, glass (glass of Example 19) comprising, as calculated by mol % based on oxides, 30% of $P_2O_5$, 45% of SnO, 22.9% of ZnO, 0.1% of $Ga_2O_3$ and 2% of CaO, was prepared.

Example 20

By the same method as in Example 1, glass (glass of Example 20) comprising, as calculated by mol % based on oxides, 30% of $P_2O_5$, 45% of SnO, 23.9% of ZnO, 0.1% of $Ga_2O_3$ and 1% of CaO, was prepared.

Example 21

By the same method as in Example 1, glass (glass of Example 21) comprising, as calculated by mol % based on oxides, 31% of $P_2O_5$, 46% of SnO, 18% of ZnO, 2% of $Ga_2O_3$ and 3% of CaO, was prepared.

Example 22

By the same method as in Example 1, glass (glass of Example 22) comprising, as calculated by mol % based on oxides, 31% of $P_2O_5$, 46% of SnO, 19% of ZnO, 1% of $Ga_2O_3$ and 3% of CaO, was prepared.

Example 23

By the same method as in Example 1, glass (glass of Example 23) comprising, as calculated by mol % based on oxides, 31% of $P_2O_5$, 46% of SnO, 19.5% of ZnO, 0.5% of $Ga_2O_3$ and 3% of CaO, was prepared.

Example 24

By the same method as in Example 1, glass (glass of Example 24) comprising, as calculated by mol % based on oxides, 31% of $P_2O_5$, 46% of SnO, 20% of ZnO, 1% of $Ga_2O_3$ and 2% of CaO, was prepared.

Example 25

By the same method as in Example 1, glass (glass of Example 25) comprising, as calculated by mol % based on oxides, 31% of $P_2O_5$, 46% of SnO, 21% of ZnO, 1% of $Ga_2O_3$ and 1% of CaO, was prepared.

Example 26

By the same method as in Example 1, glass (glass of Example 26) comprising, as calculated by mol % based on oxides, 31% of $P_2O_5$, 46% of SnO, 22% of ZnO, 0.5% of $Ga_2O_3$ and 0.5% of CaO, was prepared.

Example 27

By the following method, glass (glass of Example 27) comprising, as calculated by mol % based on oxides, 31% of $P_2O_5$, 46% of SnO, 21.5% of ZnO, 0.5% of $Ga_2O_3$, 0.5% of CaO and 0.5% of SrO, was prepared.

Firstly, in a glove box furnace maintaining a nitrogen atmosphere having a dew point of at most −50° C., prescribed amounts of tin pyrophosphate ($Sn_2P_2O_7$, manufactured by Nippon Chemical Industrial Co., Ltd.), tin oxide (SnO, manufactured by NIHON KAGAKU SANGYO CO., LTD.), zinc metaphosphate ($Zn(PO_3)_2$, manufactured by Nippon Chemical Industrial Co., Ltd.), calcium metaphosphate ($Ca(PO_3)_2$, manufactured by Nippon Chemical Industrial Co., Ltd.), gallium oxide (GaO) and strontium carbonate ($SrCO_3$) were weighed, then sealed in a plastic bag and agitated for about one minute by a hand to mix the powder homogeneously.

Then, the obtained solid product was transferred to a room having a dew point of at most −70° C. and put in a quartz crucible. A quartz cover was put on the crucible, and then, this crucible was maintained at 900° C. for 30 minutes to melt the solid product. After completion of the melting treatment, this crucible was taken out from the furnace. Further, in order to mold the melt into a plate glass, molten glass in the crucible was injected into a carbon mold. Thereafter, glass taken out from this carbon mold was put in a separate electric furnace maintained at 315° C. and maintained for one hour in this electric furnace and then cooled to room temperature over a period of 12 hours. The foregoing operation was all carried out in a glove box having a nitrogen atmosphere.

Via such a step, glass of Example 27 was obtained.

Example 28

By the same method as in Example 1, glass (glass of Example 28) comprising, as calculated by mol % based on oxides, 32% of $P_2O_5$, 45% of SnO, 18% of ZnO, 2% of $Ga_2O_3$ and 3% of CaO, was prepared.

Example 29

By the same method as in Example 1, glass (glass of Example 29) comprising, as calculated by mol % based on oxides, 32% of $P_2O_5$, 45% of SnO, 19% of ZnO, 1% of $Ga_2O_3$ and 3% of CaO, was prepared.

Example 30

By the same method as in Example 1, glass (glass of Example 30) comprising, as calculated by mol % based on oxides, 32% of $P_2O_5$, 45% of SnO, 19.5% of ZnO, 0.5% of $Ga_2O_3$ and 3% of CaO, was prepared.

Example 31

By the same method as in Example 1, glass (glass of Example 31) comprising, as calculated by mol % based on oxides, 32% of $P_2O_5$, 45% of SnO, 20% of ZnO, 1% of $Ga_2O_3$ and 2% of CaO, was prepared.

Example 32

By the same method as in Example 1, glass (glass of Example 32) comprising, as calculated by mol % based on oxides, 32% of $P_2O_5$, 45% of SnO, 21% of ZnO, 1% of $Ga_2O_3$ and 1% of CaO, was prepared.

Example 33

By the same method as in Example 1, glass (glass of Example 33) comprising, as calculated by mol % based on oxides, 32% of $P_2O_5$, 45% of SnO, 22% of ZnO, 0.5% of $Ga_2O_3$ and 0.5% of CaO, was prepared.

Example 34

By the same method as in Example 1, glass (glass of Example 34) comprising, as calculated by mol % based on oxides, 32% of $P_2O_5$, 45% of SnO, 21.5% of ZnO, 0.5% of $Ga_2O_3$, 0.5% of CaO and 0.5% of SrO, was prepared.

Example 35

By the same method as in Example 1, glass (glass of Example 35) comprising, as calculated by mol % based on oxides, 33% of $P_2O_5$, 45% of SnO, 20.5% of ZnO, 0.5% of $Ga_2O_3$ and 1% of CaO, was prepared.

Example 36

By the same method as in Example 1, glass (glass of Example 36) comprising, as calculated by mol % based on oxides, 29% of $P_2O_5$, 58% of SnO, 11.5% of ZnO, 0.5% of $Ga_2O_3$ and 1% of CaO, was prepared.

Example 37

By the same method as in Example 1, glass (glass of Example 37) comprising, as calculated by mol % based on oxides, 30% of $P_2O_5$, 54% of SnO, 11% of ZnO, 2% of $Ga_2O_3$ and 3% of CaO, was prepared.

Example 38

By the same method as in Example 1, glass (glass of Example 38) comprising, as calculated by mol % based on oxides, 28% of $P_2O_5$, 60% of SnO, 10.5% of ZnO, 0.5% of $Ga_2O_3$ and 1% of CaO, was prepared.

Example 39

By the same method as in Example 1, glass (glass of Example 39) comprising, as calculated by mol % based on oxides, 28% of $P_2O_5$, 60% of SnO, 11% of ZnO and 1% of CaO, was prepared. In this Example 39, $Ga_2O_3$ is not added, as is different from Example 1.

Example 40

By the same method as in Example 1, glass (glass of Example 40) comprising, as calculated by mol % based on oxides, 29% of $P_2O_5$, 58% of SnO, 12% of ZnO and 1% of CaO, was prepared. In this Example 40, $Ga_2O_3$ is not added, as is different from Example 1.

Example 41

By the same method as in Example 1, glass (glass of Example 41) comprising, as calculated by mol % based on oxides, 33% of $P_2O_5$, 45% of SnO, 21% of ZnO and 1% of CaO, was prepared. In this Example 41, $Ga_2O_3$ is not added, as is different from Example 1.

Example 42

By the same method as in Example 1, glass (glass of Example 42) comprising, as calculated by mol % based on oxides, 35% of $P_2O_5$, 41% of SnO, 22.5% of ZnO, 0.5% of $Ga_2O_3$ and 1% of CaO, was prepared.

Example 43

By the same method as in Example 1, glass (glass of Example 43) comprising, as calculated by mol % based on oxides, 35% of $P_2O_5$, 41% of SnO, 23% of ZnO and 1% of CaO, was prepared. In this Example 43, $Ga_2O_3$ is not added, as is different from Example 1.

In the following Tables 1 and 2, the compositions of samples in the respective Examples are summarized. In Table 1, Examples 1 to 20 are Working Examples of the present invention. In Table 2, Examples 21 to 37 are Working Examples of the present invention, and Examples 38 to 43 are Comparative Examples.

TABLE 1

| Composition (mol %) | Examples | | | | | | | | | | |
|---|---|---|---|---|---|---|---|---|---|---|---|
| | 1 | 2 | 3 | 4 | 5 | 6 | 7 | 8 | 9 | 10 | 11 |
| $P_2O_5$ | 30 | 30 | 30 | 30 | 30 | 30 | 30 | 30 | 30 | 30 | 30 |
| SnO | 46 | 44 | 46 | 48 | 50 | 52 | 46 | 46 | 46 | 46 | 46 |
| ZnO | 20.5 | 21 | 19 | 17 | 15 | 13 | 20 | 20 | 21 | 21.5 | 22 |
| $Ga_2O_3$ | 0.5 | 2 | 2 | 2 | 2 | 2 | 1 | 2 | 2 | 2 | 1 |
| CaO | 3 | 3 | 3 | 3 | 3 | 3 | 3 | 2 | 1 | 0.5 | 1 |
| SrO | 0 | 0 | 0 | 0 | 0 | 0 | 0 | 0 | 0 | 0 | 0 |
| X* | 24 | 26 | 24 | 22 | 20 | 18 | 24 | 24 | 24 | 24 | 24 |
| Glass transition temperature Tg (°C.) | 312 | 321 | 320 | 316 | 312 | 309 | 312 | 312 | 311 | 307 | 307 |
| Coefficient of linear thermal expansion α (×10$^{-7}$/°C.) | 105 | 105 | 105 | 107 | 110 | 114 | 105 | 105 | 105 | 104 | 106 |
| Weather resistance (500 hr) | ○ | ○ | ○ | ○ | ○ | ○ | ○ | ○ | ○ | ○ | ○ |
| Weather resistance (1,000 hr) | ○ | ○ | ○ | ○ | ○ | ○ | ○ | ○ | ○ | ○ | ○ |

| Composition (mol %) | Examples | | | | | | | | |
|---|---|---|---|---|---|---|---|---|---|
| | 12 | 13 | 14 | 15 | 16 | 17 | 18 | 19 | 20 |
| $P_2O_5$ | 30 | 30 | 30 | 30 | 30 | 30 | 30 | 30 | 30 |
| SnO | 46 | 46 | 46 | 45 | 45 | 45 | 45 | 45 | 45 |
| ZnO | 23 | 20.7 | 20.9 | 21 | 21.5 | 21.7 | 21.9 | 22.9 | 23.9 |
| $Ga_2O_3$ | 0.5 | 0.3 | 0.1 | 1 | 0.5 | 0.3 | 0.1 | 0.1 | 0.1 |
| CaO | 0.5 | 3 | 3 | 3 | 3 | 3 | 3 | 2 | 1 |
| SrO | 0 | 0 | 0 | 0 | 0 | 0 | 0 | 0 | 0 |
| X* | 24 | 24 | 24 | 25 | 25 | 25 | 25 | 25 | 25 |
| Glass transition temperature Tg (°C.) | 303 | 311 | 317 | 321 | 314 | 314 | 314 | 312 | 308 |
| Coefficient of linear thermal expansion α (×10$^{-7}$/°C.) | 104 | 107 | 108 | 107 | 106 | 107 | 107 | 105 | 108 |
| Weather resistance (500 hr) | ○ | ○ | ○ | ○ | ○ | ○ | ○ | ○ | ○ |
| Weather resistance (1,000 hr) | ○ | ○ | ○ | ○ | ○ | ○ | ○ | ○ | ○ |

X*: Sum of ZnO, $Ga_2O_3$ and CaO

TABLE 2

| Composition (mol %) | Examples | | | | | | | | | | | |
|---|---|---|---|---|---|---|---|---|---|---|---|---|
| | 21 | 22 | 23 | 24 | 25 | 26 | 27 | 28 | 29 | 30 | 31 | 32 |
| $P_2O_5$ | 31 | 31 | 31 | 31 | 31 | 31 | 31 | 32 | 32 | 32 | 32 | 32 |
| SnO | 46 | 46 | 46 | 46 | 46 | 46 | 46 | 45 | 45 | 45 | 45 | 45 |
| ZnO | 18 | 19 | 19.5 | 20 | 21 | 22 | 21.5 | 18 | 19 | 19.5 | 20 | 21 |
| $Ga_2O_3$ | 2 | 1 | 0.5 | 1 | 1 | 0.5 | 0.5 | 2 | 1 | 0.5 | 1 | 1 |
| CaO | 3 | 3 | 3 | 2 | 1 | 0.5 | 0.5 | 3 | 3 | 3 | 2 | 1 |
| SrO | 0 | 0 | 0 | 0 | 0 | 0 | 0.5 | 0 | 0 | 0 | 0 | 0 |
| X* | 23 | 23 | 23 | 23 | 23 | 23 | 22.5 | 23 | 23 | 23 | 23 | 23 |
| Glass transition temperature Tg (° C.) | 315 | 314 | 311 | 310 | 305 | 304 | 308 | 311 | 309 | 308 | 311 | 302 |
| Coefficient of linear thermal expansion α ($\times 10^{-7}$/° C.) | 110 | 114 | 105 | 107 | 108 | 109 | 111 | 108 | 108 | 108 | 110 | 110 |
| Weather resistance (500 hr) | ○ | ○ | ○ | ○ | ○ | ○ | ○ | ○ | ○ | ○ | ○ | ○ |
| Weather resistance (1,000 hr) | ○ | ○ | ○ | ○ | ○ | ○ | ○ | ○ | ○ | ○ | ○ | ○ |

| Composition (mol %) | Examples | | | | | | | | | | |
|---|---|---|---|---|---|---|---|---|---|---|---|
| | 33 | 34 | 35 | 36 | 37 | 38 | 39 | 40 | 41 | 42 | 43 |
| $P_2O_5$ | 32 | 32 | 33 | 29 | 30 | 28 | 28 | 29 | 33 | 35 | 35 |
| SnO | 45 | 45 | 45 | 58 | 54 | 60 | 60 | 58 | 45 | 41 | 41 |
| ZnO | 22 | 21.5 | 20.5 | 11.5 | 11 | 10.5 | 11 | 12 | 21 | 22.5 | 23 |
| $Ga_2O_3$ | 0.5 | 0.5 | 0.5 | 0.5 | 2 | 0.5 | 0 | 0 | 0 | 0.5 | 0 |
| CaO | 0.5 | 0.5 | 1 | 1 | 3 | 1 | 1 | 1 | 1 | 1 | 1 |
| SrO | 0 | 0.5 | 0 | 0 | 0 | 0 | 0 | 0 | 0 | 0 | 0 |
| X* | 23 | 22.5 | 22 | 13 | 16 | 12 | 12 | 13 | 22 | 24 | 24 |
| Glass transition temperature Tg (° C.) | 299 | 298 | 305 | 296 | 306.5 | 294 | 292 | 295 | 304 | 308 | 306 |
| Coefficient of linear thermal expansion α ($\times 10^{-7}$/° C.) | 111 | 111 | 108 | 120 | 117 | 125 | 125 | 122 | 113 | 109 | 109 |
| Weather resistance (500 hr) | ○ | ○ | ○ | ○ | ○ | ○ | ○ | ○ | x | x | x |
| Weather resistance (1,000 hr) | ○ | ○ | ○ | ○ | x | ○ | x | x | — | — | — |

X*: Sum of ZnO, $Ga_2O_3$ and CaO

In Tables 1 and 2, X is the sum (as represented by mol % based on oxides) of ZnO, $Ga_2O_3$ and CaO.

In each of glasses in Example 1 to 43, no coloration or turbidity due to devitrification was observed, and these glasses were transparent.

Weather Resistance Test

By the following method, the weather resistance of a sample of glass in each Example was evaluated.

Firstly, each sample was processed into a flat plate having a thickness of 2 mm, and the front surface and rear surface were polished until they became mirror surfaces. Using the polished sample, the spectral transmittance at a wavelength of 460 nm was measured. For the measurement, a spectral transmittance measuring device (called LAMBDA 950, manufactured by Perkin Elmer) was used. The obtained transmittance is designated as $V_0$.

Then, in order to evaluate the weather resistance of each sample, each sample was put in a constant temperature and humidity tank at 80° C. under a relative humidity of 80% and maintained for a prescribed time (e.g. time t). Thereafter, each sample was taken out, and the spectral transmittance was measured by the above-described method. The obtained transmittance is designated as $V_t$. Thereafter, each sample was returned again into the constant temperature and humidity tank.

This operation was repeated up to 500 hours. The spectral transmittance of each sample obtained after the 500 hours is designated as $V_{500}$. Here, in a case where the ratio of the spectral transmittance $V_{500}$ after the 500 hours to the transmittance $V_0$ before placing the sample in the constant temperature and humidity tank (i.e. $V_{500}/V_0$) became at least 0.9, the weather resistance of such a sample was judged to be good. On the other hand, in a case where $V_{500}/V_0$ became less than 0.9, the weather resistance of such a sample was evaluated to be poor, and the test was completed.

Further, with respect to a sample which showed good light resistance with the ratio $V_{500}/V_0$ being at least 0.9, evaluation of the weather resistance was further continued to 1,000 hours.

After completion of the test for 1,000 hours, each sample was taken out, and the spectral transmittance was measured by the above-described method. The obtained transmittance of the sample is designated as $V_{1,000}$. By using this value, the ratio of the spectral transmittance $V_{1,000}$ after the 1,000 hours to the transmittance $V_0$ before the sample was placed in the constant temperature and humidity tank (i.e. $V_{1,000}/V_0$) was obtained.

A sample having a ratio $V_{1000}/V_0$ of at least 0.9 was judged to be a sample having excellent weather resistance.

In the above Tables 1 and 2, the results of the weather resistance test obtained with respect to the respective samples are summarized.

In Tables 1 and 2, symbol mark "○" in the space for weather resistance (500 hr) represents that the sample had $V_{500}/V_)$ of at least 0.9. Likewise, symbol mark "○" in the space for weather resistance (1,000 hr) represents that the sample had $V_{1000}/V_0$ of at least 0.9. Further, in Tables 1 and 2, symbol mark "×" in the space for weather resistance (500 hr) represents that the sample had $V_{500}/V_0$ of less than 0.9, and symbol "×" in the space for weather resistance (1,000 hr) represents that the sample had $V_{1000}/V_0$ of less than 0.9. Symbol mark "–" means that the test for 1,000 hours was not carried out, since the weather resistance after 500 hours of the sample $V_{500}V_0$ was less than 0.9.

From the Tables, it is evident that the samples in Examples 41 to 43 (the samples in Comparative Examples) did not show good weather resistance. On the other hand, it is evident that the samples in Examples 1 to 40 showed good weather resistance in the test for 500 hours. Particularly, it is evident that the samples in Examples 1 to 36 and 38 showed good weather resistance also in the test for 1,000 hours and thus has excellent weather resistance.

Thus, the glasses of the present invention (samples in Examples 1 to 37) were confirmed to show stabilized weather resistance for a long period of time. Particularly, the samples in Examples 1 to 36 were confirmed to have excellent weather resistance.

Measurement of Coefficient of Linear Thermal Expansion (α)

Then, each sample was processed into a cylindrical shape having a diameter of 5 mm and a length of 20 mm, and using this test sample, the coefficient of linear thermal expansion (a) was measured. For the measurement of the coefficient of linear thermal expansion (α), a thermal dilatometer (horizontal differential detection system thermal dilatometer TD5010, manufactured by Bruker AXS) was used. By using this thermal expansion meter, each test sample was heated to 300° C. at a temperature raising rate of 10° C./min to measure the elongation of the test sample at each temperature. Specifically, the elongation values of the test sample at from 100 to 300° C. were measured every 25° C., and the average value was taken as the coefficient of linear thermal expansion (α).

Figure 2:
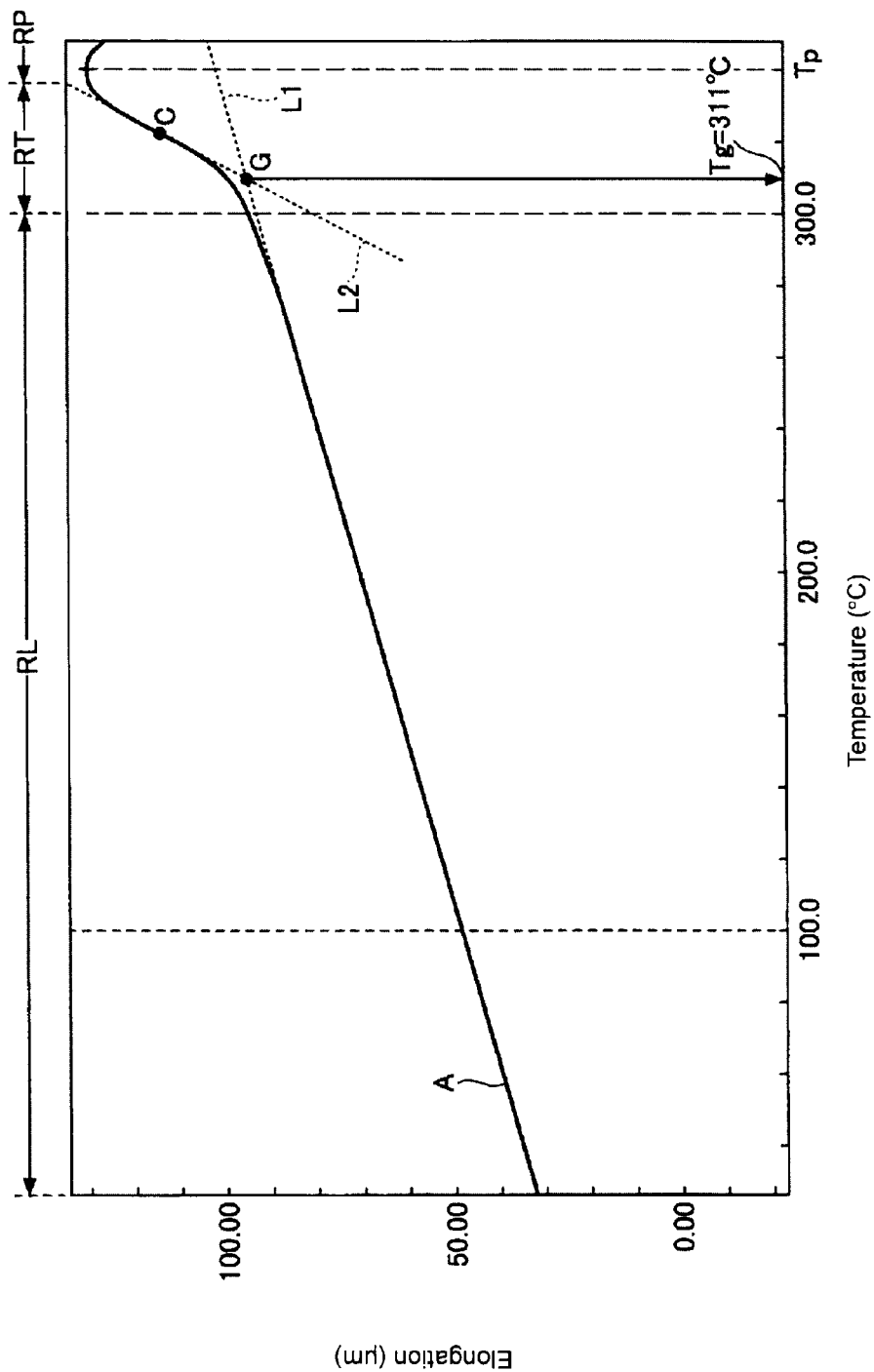
FIG. 2 is a diagram schematically illustrating an operation to obtain a glass transition temperature (Tg) from a temperature change in elongation of a sample.

FIG. 2 shows an example of the results of measurement of the coefficient of linear thermal expansion (α). This Fig. is one showing the results of measurement obtained by a sample in Example 28. In the case of the sample in Example 28, the coefficient of linear thermal expansion (α) was estimated to be about $108 \times 10^{-7}/°$ C.

In the above Tables 1 and 2, the results of measurement of coefficients of thermal expansion obtained with respect to the respective samples are summarized.

In the above-described weather resistance test, also samples in Examples 38 to 40 corresponding to Comparative Examples (particularly the sample in Example 38) showed good weather resistance. However, from the results of measurement of the coefficient of linear thermal expansion (α), it was found that with samples in Examples 38 to 40, the coefficient of linear thermal expansion showed a high value of at least $122 \times 10^{-7}/°$ C. Therefore, if a LED assembly is covered by a glass covering material having the same composition as these samples, cracking is likely to occur in the glass covering material due to the difference in the coefficient of thermal expansion between the glass covering material and the LED element in the process of cooling this LED device to room temperature or in the subsequent steps.

Whereas, with samples in Examples 1 to 37, the coefficient of linear thermal expansion is not higher than $120 \times 10^{-7}/°$ C. even at the maximum. Especially, with samples in Examples 1 to 35, the coefficient of linear thermal expansion is not higher than $114 \times 10^{-7}/°$ C. even at the maximum, and thus with these samples, the coefficient of thermal expansion is low.

Thus, glasses of the present invention (samples in Examples 1 to 37) were confirmed to show low coefficients of linear thermal expansion of not higher than $120 \times 10^{-7}/°$ C. Accordingly, when a LED assembly is covered by a glass covering material having the same composition as these samples, it is possible to avoid breakage of the covering material which is likely to occur due to the difference in the coefficient of thermal expansion between the covering material and other components in the step of cooling the covering material or during the storage period of the LED device.

Measurement of glass Transition Temperature (Tg) (Reference)

Then, the glass transition temperature (Tg) of each sample was measured. The glass transition temperature (Tg) was measured as follows, by using the results of measurement obtained by the above measurement of the coefficient of linear thermal expansion (α) (raw data).

FIG. 2 shows an operation at the time of measuring the glass transition temperature (Tg) of each sample.

In FIG. 2, curve A is an example of the results of measurement obtained in the measurement of the coefficient of linear thermal expansion (α). The abscissa represents the temperature (° C.) of the test sample, and the ordinate represents the elongation (μm) of the test sample.

In a usual case, curve A has three regions i.e. a linear region RL (a region in which the elongation to the temperature can be approximated substantially by a linear line), a peak region RP (a region of ±10° C. with the temperature Tp where the elongation become maximum at the center) and a transition region RT between the two.

Firstly, in this curve A, linear line L1 fitting to the linear region RL is drawn. Then, in the transition region RT in curve A, inflection point C of the curve is obtained. Further, linear line L2 which passes through the inflection point C and which contacts curve A, is drawn.

Intersection G of the two linear lines L1 and L2 thus obtained is taken as the glass transition temperature (Tg).

In the above Tables 1 and 2, the results of measurement of the glass transition temperatures Tg obtained with respect to the respective samples are summarized.

From the results, it is evident that in each sample, the glass transition temperature (Tg) is a low value of not higher than 321° C. even at the maximum.

From these results, it has been confirmed that by using the glass of the present invention, it is possible to carry out covering treatment at a low temperature of at most 400° C.

INDUSTRIAL APPLICABILITY

The glass of the present invention is useful for covering and/or sealing of a LED element to be used for e.g. a backlight source for liquid crystal panels, general illumination, head light for automobiles, etc.

The entire disclosure of Japanese Patent Application No. 2011-010242 filed on Jan. 20, 2011 including specification, claims, drawings and summary is incorporated herein by reference in its entirety.

| REFERENCE SYMBOLS | |
|---|---|
| 1: | LED device |
| 100: | Light-emitting portion |
| 101: | Substrate for element |
| 102: | LED element |
| 103: | Positive electrode |
| 104: | Negative electrode |
| 110: | Covering portion |
| 115: | Covering material |
| 120: | Base substrate |
| 130a, 130b: | Wirings |

What is claimed is:

1. Glass comprising, as represented by mol % based on oxides, from 29% to 33% of $P_2O_5$, from 43% to 58% of SnO, from 11% to 25% of ZnO, from 0.1% to 2% of $Ga_2O_3$, from 0.5% to 5% of CaO, and from 0% to 1% of SrO, provided that the sum X of ZnO, $Ga_2O_3$ and CaO is within a range of from 13% to 27%, as represented by mol % based on oxides.

2. The glass according to claim 1, which comprises, as represented by mol % based on oxides, from 30% to 33% of $P_2O_5$, from 44% to 53% of SnO, from 13% to 24% of ZnO, from 0.1% to 2% of $Ga_2O_3$, from 0.5% to 3% of CaO, and from 0% to 1% of SrO, wherein said X is within a range of from 18% to 26%.

3. The glass according to claim 1, which has a coefficient of linear thermal expansion of at most $120\times10^{-7}/°$ C.

4. A glass covering material for a light-emitting device, which is made of the glass as defined in claim 1.

5. The glass covering material according to claim 4, wherein the light-emitting device is a light-emitting device using a LED element.

6. A light-emitting device comprising an optical element disposed on a base substrate, and a covering material covering the optical element, wherein the covering material is made of the glass as defined in claim 1.

7. The light-emitting device according to claim 6, wherein the optical element is LED.

* * * * *